(12) United States Patent
Nishimura

(10) Patent No.: US 7,633,816 B2
(45) Date of Patent: Dec. 15, 2009

(54) SEMICONDUCTOR MEMORY DEVICE, REWRITE PROCESSING METHOD THEREFOR, AND PROGRAM THEREOF

(75) Inventor: Kozo Nishimura, Osaka (JP)

(73) Assignee: Panasonic Corporation, Osaka (JP)

( * ) Notice: Subject to any disclaimer, the term of this patent is extended or adjusted under 35 U.S.C. 154(b) by 394 days.

(21) Appl. No.: 11/631,482

(22) PCT Filed: Jul. 14, 2005

(86) PCT No.: PCT/JP2005/013041

§ 371 (c)(1),
(2), (4) Date: Jan. 4, 2007

(87) PCT Pub. No.: WO2006/009069

PCT Pub. Date: Jan. 26, 2006

(65) Prior Publication Data

US 2008/0049535 A1 Feb. 28, 2008

(30) Foreign Application Priority Data

Jul. 21, 2004 (JP) ............................. 2004-213173

(51) Int. Cl.
*G11C 7/00* (2006.01)
*G11C 7/22* (2006.01)

(52) U.S. Cl. ............................ 365/189.14; 365/189.16; 365/189.07

(58) Field of Classification Search ............ 365/189.14, 365/189.16, 189.07
See application file for complete search history.

(56) References Cited

U.S. PATENT DOCUMENTS 6,421,279 B1 * 7/2002 Tobita et al. .......... 365/189.011

FOREIGN PATENT DOCUMENTS

| JP | 53-087636 | 8/1978 |
|---|---|---|
| JP | 04-289599 | 10/1992 |
| JP | 2002-366420 | 12/2002 |
| JP | 2003-324150 | 11/2003 |

\* cited by examiner

*Primary Examiner*—Amir Zarabian
*Assistant Examiner*—Kretelia Graham
(74) *Attorney, Agent, or Firm*—Wenderoth, Lind & Ponack, L.L.P.

(57) ABSTRACT

A comparing unit (12) in a readout control unit (11) compares one bit data stored in a memory body (20) with a value stored in a data storage unit B[m] which is prepared to store the one bit data. The data storage unit B[m] includes three memory cells MC[k] and the stored value of the data storage unit B[m] is obtained by a logical operation unit (16) operable to calculate an exclusive OR with respect to the three memory cells MC[k]. When mismatching is detected in the comparing unit (12), a rewrite cell determination unit (13) determines one of the three memory cells MC[k], to which rewriting of the stored value is performed. In the case where the stored value in the data storage unit B[m], if the data storage unit B[m] has a memory cell MC[k] to which writing can be performed, the writing is performed in priority to erasing.

11 Claims, 13 Drawing Sheets

| | (a) | | | (b) | | |
|---|---|---|---|---|---|---|
| | MC[1] MC[2] MC[3] | | | MC[1] MC[2] MC[3] | | |
| (1) | ( 1 1 1 ) | | | 1→0 | 1 | 1→0 |
| (2) | ( 0 1 0 ) | | | 0 | 1→0 | 0 |
| (3) | ( 0 0 0 ) | ERASE | | 0→1 | 0→1 | 0→1 |
| (4) | ( 0 0 1 ) | ERASE | | 1 | 1→0 | 1→1 |
| (5) | ( 1 0 0 ) | ERASE | | 1→1 | 1→0 | 1→0 |
| (6) | ( 1 1 0 ) | | | 1 | 1 | 0 |
| (7) | ( 1 0 0 ) | ERASE | | 1→1 | 1→0 | 0→1→0 |
| (8) | ( 1 1 0 ) | | | 1 | 1 | 0 |

SEMICONDUCTOR MEMORY DEVICE, REWRITE PROCESSING METHOD THEREFOR, AND PROGRAM THEREOF

TECHNICAL FIELD

The present invention relates to a semiconductor memory device and in particular to a semiconductor memory device including memory cells which have at least two storage statuses and which differ from one another in rewrite speed or in extent of the deterioration of the cells resulting from rewriting depending on any one of the storage statuses brought about by rewriting data, a rewrite processing method for the device, and a program of the processing.

BACKGROUND ART

Nonvolatile memories typified by flash memories are used in a memory card for a digital camera etc., storage of BIOS for a personal computer, and so on as low power consumption memories capable of continuing to hold storage even after power has been turned off.

A stored value in a memory cell of the flash memory is determined by the amount of electrons accumulated in a floating gate as in cases where, for example, the value is 0 when the predetermined amount or more of electrons are accumulated in the floating gate and the value is 1 when electrons less than the predetermined amount are accumulated in the floating gate.

In the case where each of the values in the memory cells are determined in a manner as described above, changing a stored value in the memory cell to 0 is referred to as "writing", and changing the stored value to 1 is referred to as "erasing" in general. "Writing" is performed by making a gate voltage sufficiently higher than a source voltage and a drain voltage. Through this operation, electrons are injected from a source region into the floating gate. On the other hand, "erasing" is performed by making the source voltage sufficiently higher than the gate voltage. Through this operation, electrons accumulated in the floating gate are pulled off into the source region. Since the erase operation causes damage to an insulating film under the floating gate, the lifetime of flash memories is determined by the number of times the erasing is performed.

Stored values in the flash memory cannot be rewritten with source electrodes or drain electrodes being grounded. Thus, by controlling all the voltages (source, drain, and gate voltages), the stored values can be rewritten. However, to control the three voltages for each of the memory cells, complexity in circuitry and size of a device increase. Hence, in general, the gate voltage is controlled by the sector including a plurality of the memory cells.

In cases where gate voltage is controlled by the sector, "writing" is performed by the memory cell, whereas "erasing" is performed by the sector. More specifically, when a stored value in a certain memory cell is rewritten from 0 to 1, data stored in all the memory cells of a sector including the memory cell is initially erased, and then verify processing is performed in order to check that stored values in the memory cells are 1, subsequently the value 0 is written into the memory cells where there has been no need to change the stored values to 1. At the result, only the stored values in the desired memory cells are finally rewritten from 0 to 1.

Since stored values in memory cells where there is no need to rewrite the stored values are also erased by performing the erase operation by the sector, the number of times the stored values in the memory cells are erased increases and therefore, the performance of the memory body, as well as that of the memory cells, degrades.

Therefore, as disclosed in Patent Reference 1, a semiconductor memory device has been proposed in which variations in the number of times erasing is performed by the sector are eliminated by providing reserve sectors aside from main sectors to store data in the memory cells of the sectors where the number of times erasing is performed is few. Since the occurrence of faulty sectors is suppressed by eliminating the variations in the number of times erasing is performed by the sector, the memory body can be used for a longer time.

[Patent Reference 1] Japanese Laid-Open Patent Publication No. 2002-366420 (pages 1-21 and FIG. 1)

DISCLOSURE OF THE INVENTION

Problems to be Solved by the Invention

However, since erase operation performed by the sector causes an erase operation also on memory cells which do not actually have necessity thereof, and therefore, it is inevitable that the memory cells are unnecessarily damaged. Therefore, how the memory bodies of a nonvolatile memory device can be used for a long time becomes a problem.

Recently, since the miniaturization of memory cells and an increase in memory capacity have been advancing, it is believed that a case will arise where there is no need to excessively consider the disadvantage due to an increase in the number of the memory cells, if the memories can be used for a long time. In particular, if they can be used for a long time and rewriting time required for erasing can be reduced, there may be cases where advantages can be obtained which exceed the disadvantages that the number of necessary memory cells increases and circuits increase in complexity.

Therefore an object of the present invention is to provide a semiconductor memory device having a memory body which can be used for a longer time for the purpose of being included in a semiconductor memory device whose performance degrades due to the rewriting of stored data. In addition, another object of the invention is to provide a semiconductor memory device which makes it possible to further shorten rewriting time.

Solution to the Problems

A semiconductor memory device according to a present invention includes a plurality of memory cells each having two or more storage statuses. A rewrite speed or a degree of deterioration of the memory cells varies depending on which one of the storage statuses is caused by rewriting. The device includes a memory body including a plurality of data storage units, each of which has a plurality of the memory cells and stores a value of one bit; a read/rewrite control unit for performing a process of reading stored values in the memory cells, and a process of rewriting the stored values in the memory cells; an operation unit for performing an operation with the stored values in the memory cells which constitute the determined data storage unit to obtain a stored value in the data storage unit; a comparing unit for comparing the stored value in the data storage unit obtained by the operation unit and an externally inputted value and outputting a signal indicating matching or mismatching therebetween; and a rewrite cell determination unit for determining the memory cell whose stored value needs to be changed such that the stored value in the data storage unit is equal to the externally inputted value when the comparing unit outputs the signal indicating the mismatching.

The operation unit may include an exclusive-OR circuit. In that case, each of the data storage units may have a capacity for storing three or more odd bits of data.

The number of the memory cells included in each of the individual data storage units may differ depending on each of the data storage units.

The read/rewrite control unit may change the stored values in the data storage units by performing either one of the processes: an individual rewrite process of rewriting the stored values in the memory cells for each of the memory cells; and a batch rewrite process of rewriting the stored values in the memory cells for each one or more of the data storage units.

The memory body may be a flash memory. In that case, the individual rewrite process may represent a write process, and the batch rewrite process may represent an erase process.

When a time period required for a first rewriting of rewriting the stored value in the memory cell to the value of either 0 or 1, is shorter than a time period required for a second rewriting of rewriting the stored value in the memory cell to the other value, the first rewriting may be performed in the individual rewrite process, and the second rewriting may be performed in the batch rewrite process.

The device further may further include a specific rewrite cell determination unit for determining the memory cells which are included in a data storage unit where there is no need to change the stored values thereof and have a capacity for storing even bits of data to be written in the second rewriting, and the read/rewrite control unit may rewrite each of the stored values in the memory cells determined by the specific rewrite cell determination unit when the batch rewrite processing is performed.

Each of the memory cells may be a multivalued memory cell having a capacity for storing multiple bits of data.

A rewrite processing method according to the present invention is a method for rewriting a semiconductor memory device including a plurality of memory cells each having two or more storage statuses. A rewrite speed or a degree of deterioration of the memory cells varying depending on which one of the storage status is caused by rewriting. The method includes determining, among a plurality of data storage units, each of which has a plurality of the memory cells and stores a value of one bit, one of the data storage units so as to store externally inputted data; performing an operation with the stored values in the memory cells which constitute the determined data storage unit to obtain a stored value in the data storage unit; comparing the stored values in the data storage unit obtained by the operation and the externally inputted value to determine whether both values match each other; determining the memory cell whose stored value needs to be changed such that the stored value in the data storage unit is equal to the externally inputted value when the determination result indicates mismatching; and rewriting the stored value in the memory cell where the change of the stored value is determined.

A program according to the present invention is a program for executing operations of rewriting of a semiconductor memory device including a plurality of memory cells each having two or more storage statuses. A rewrite speed or a degree of deterioration of the memory cells varying depending on which one of the storage status is caused by rewriting. The program causes a CPU to perform the operations including: determining, among a plurality of data storage units, each of which has a plurality of the memory cells and stores a value of one bit, one of the data storage units so as to store externally inputted data; performing an operation with the stored values in the memory cells which constitute the determined data storage unit to obtain a stored value in the data storage unit; comparing the stored values in the data storage unit obtained by the operation and the externally inputted value to determine whether both values match each other; determining the memory cell whose stored value needs to be changed such that the stored value in the data storage unit is equal to the externally inputted value when the determination result indicates mismatching; and rewriting the stored value in the memory cell where the change of the stored value is determined.

EFFECT OF THE INVENTION

Since the semiconductor memory device according to the present invention converts one bit of data to be stored to multiple bits of data so as to store data, the number of rewriting to each of the memory cells is reduced, whereby the memory body can be used for a longer time.

If the rewriting is performed only when a comparison between a value that has been already stored in the data storage units and a values that is to be stored result in mismatching, needless rewriting can be eliminated. Consequently, the number of erasing can be reduced, whereby the memory body can be used for a longer time, and rewriting time can also be shortened.

And further, when it has been found that which data is frequently written, the number of erasing can be reduced by storing the data in the data storage unit having large number of the memory cells, whereby the memory body can be used for a longer time.

Still further, in a case where one data storage unit has a capacity for storing three or more odd bits of data, the stored value in the data storage unit after a batch rewrite process is varies from that before the batch process. Thus, there is no need to perform individual rewrite processing after the batch rewrite processing, whereby rewriting time can be shortened.

Furthermore, rewriting time can be shortened by performing long-time rewrite processing by the batch and short-time rewrite processing individually than performing long-time rewrite processing individually and short-time rewrite processing by the batch.

When the batch rewrite process is performed and thus other rewrite processes cannot be performed, the number of the rewrite processes performed with different timings can be reduced by rewriting the stored values in the memory cells, which are determined by the specific rewrite cell determination unit, concurrently with the batch rewrite process. Therefore, it is possible to gain time until the next batch rewriting, whereby rewriting time can be shortened. In this case, the stored values in the data storage units do not change by rewriting the stored values of even bits of data.

BRIEF DESCRIPTION OF THE DRAWINGS

FIG. 6 is a table showing change in stored values in memory cells MC[k] and data storage units B[m] through rewriting.

FIG. 7 is a table showing change in stored values in a conventional semiconductor memory device through rewriting.

Figure 1:
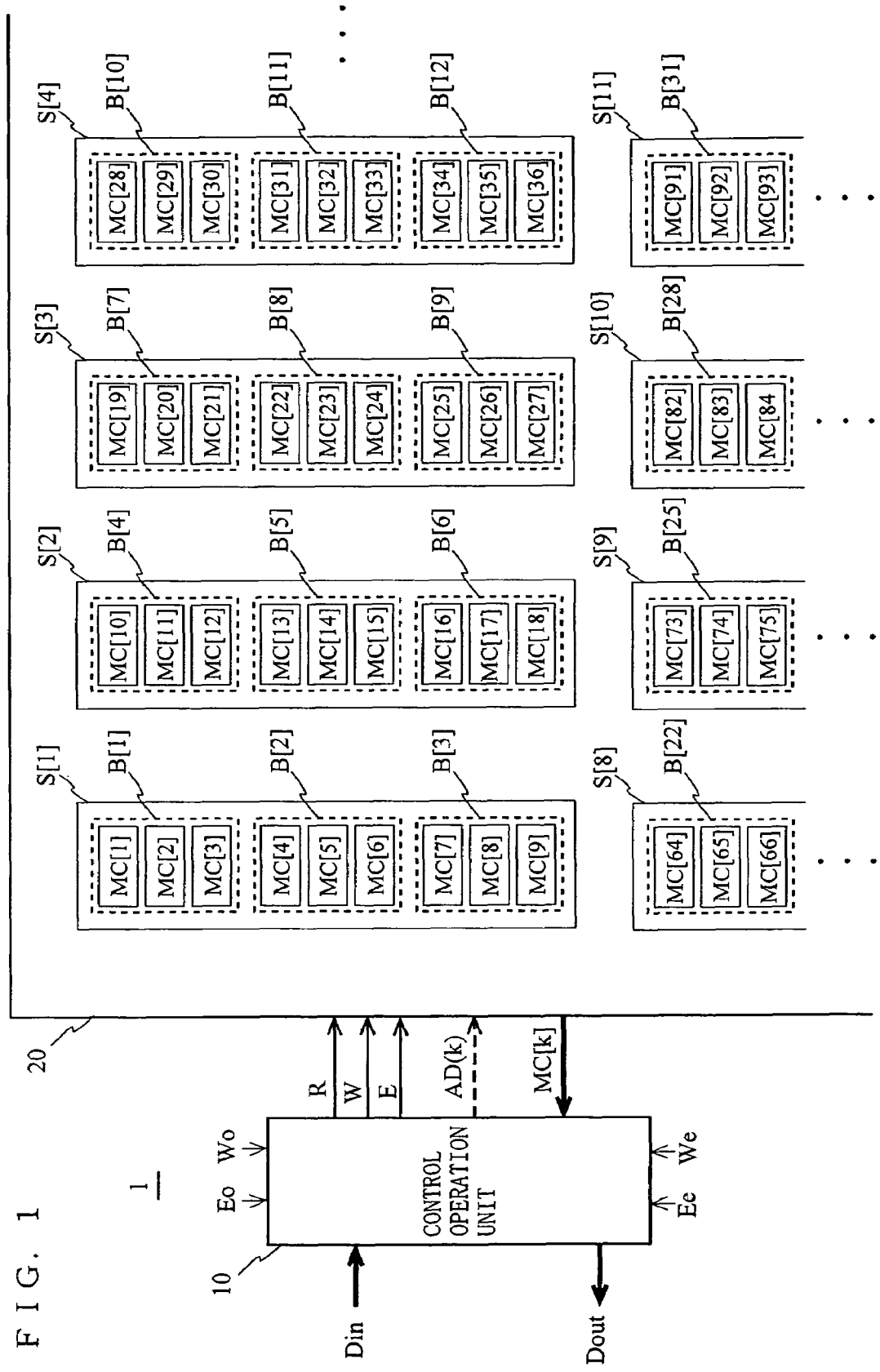
FIG. 1 is a block diagram of a semiconductor memory device according to a first embodiment of the present invention.

DESCRIPTION OF THE REFERENCE CHARACTERS 1 semiconductor memory device
2 semiconductor memory device
3 semiconductor memory device
10 control operation unit
10a control operation unit
10b control operation unit
11 readout control unit
12 comparing unit
13 rewrite cell determination unit
14 rewrite control unit
15 erase cell decision unit
16 logical operation unit
20 memory body
20a memory body
20b memory body

BEST MODE FOR CARRYING OUT THE INVENTION

First Embodiment

FIG. 1 is a block diagram of a semiconductor memory device 1 according to a first embodiment of the present invention. The semiconductor memory device 1 includes a control operation unit 10 and a memory body 20.

The memory body 20 includes a plurality of nonvolatile 1-bit storage memory cells MC[k] (k is a natural number) which are capable of continuing to hold stored data even after power has been turned off. In this embodiment, an explanation will be made based on the premise that the memory cells MC[k] are flash memory cells, each of which has a source electrode, a drain electrode, a floating gate and a gate electrode on a semiconductor substrate. And further, it is premised that a stored value, which is provided when the amount of electrons accumulated in the floating gate is equal to or larger than a predetermined amount, is 0, and a stored value, which is provided when the amount of electrons accumulated in the floating gate is smaller than the predetermined amount, is 1. Although not shown in FIG. 1, the memory cells MC[k] are arranged in a memory cell arrangement region of the memory body 20 in the form of a matrix.

Individual data storage units B[m] (m is a natural number) include the three memory cells MC[k]. Moreover, the three data storage units B[m] constitute one sector S[n] (n is a natural number). The memory cells MC[k] present in the same sector S[n] are connected to the same word line (voltage supply line).

When the stored value in the memory cell MC[k] is rewritten from 1 to 0, a high voltage is applied to the gate electrode such that a predetermined amount or more of electric charge is accumulated in the floating gate. The rewriting is performed by the memory cell MC[k] by individually controlling source voltages and drain voltages. Such rewriting is hereinafter referred to as "writing".

On the other hand, when the stored value in the memory cell MC[k] is rewritten from 0 to 1, a high voltage is applied to the source electrode so as to pull off the electric charge accumulated in the floating gates is extracted into the source region. The rewriting is performed by the sector S[n]. Such rewriting is hereinafter referred to as "erasing".

Figure 2:
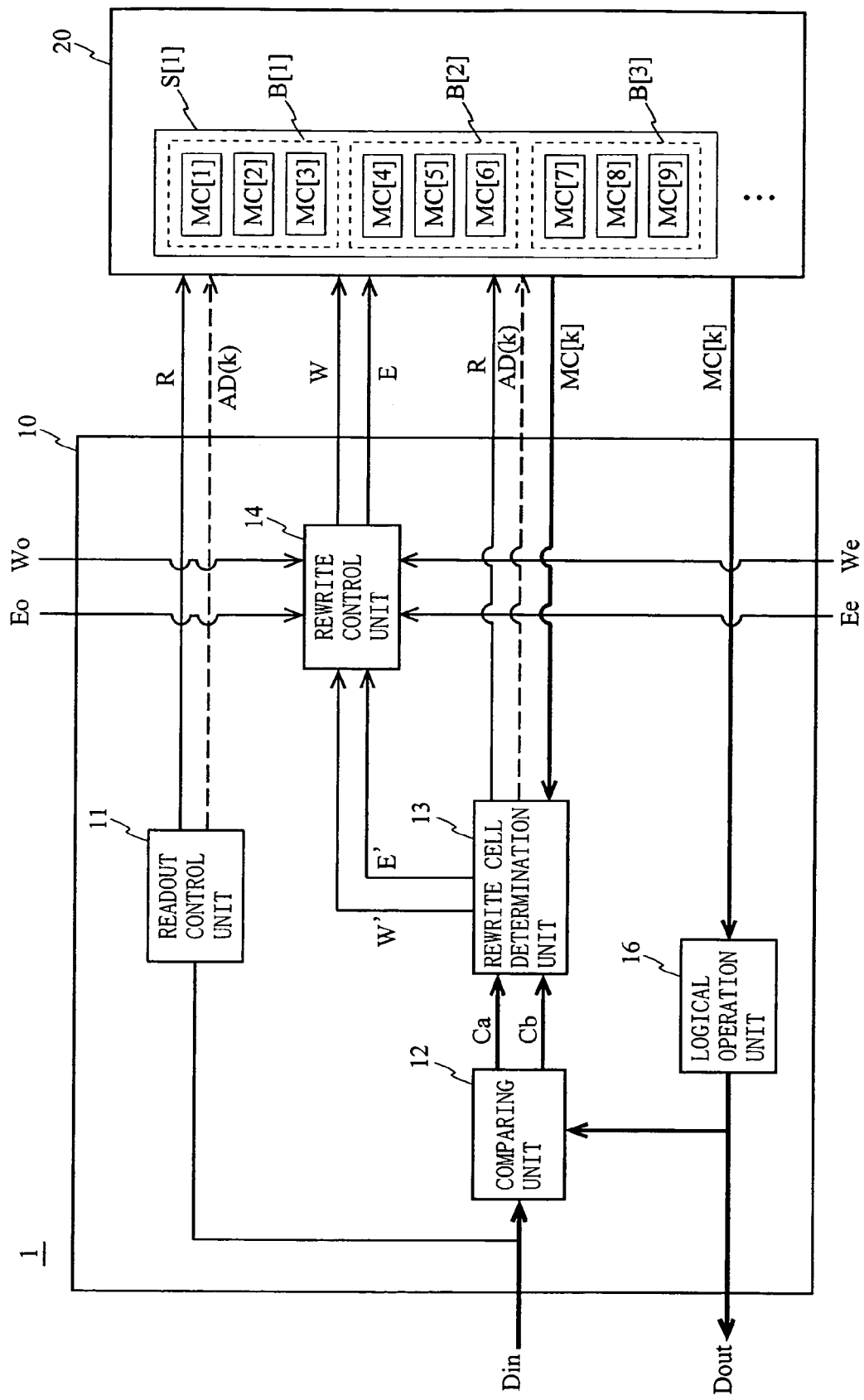
FIG. 2 is a block diagram showing a detail configuration of a control operation unit.
Figure 3:
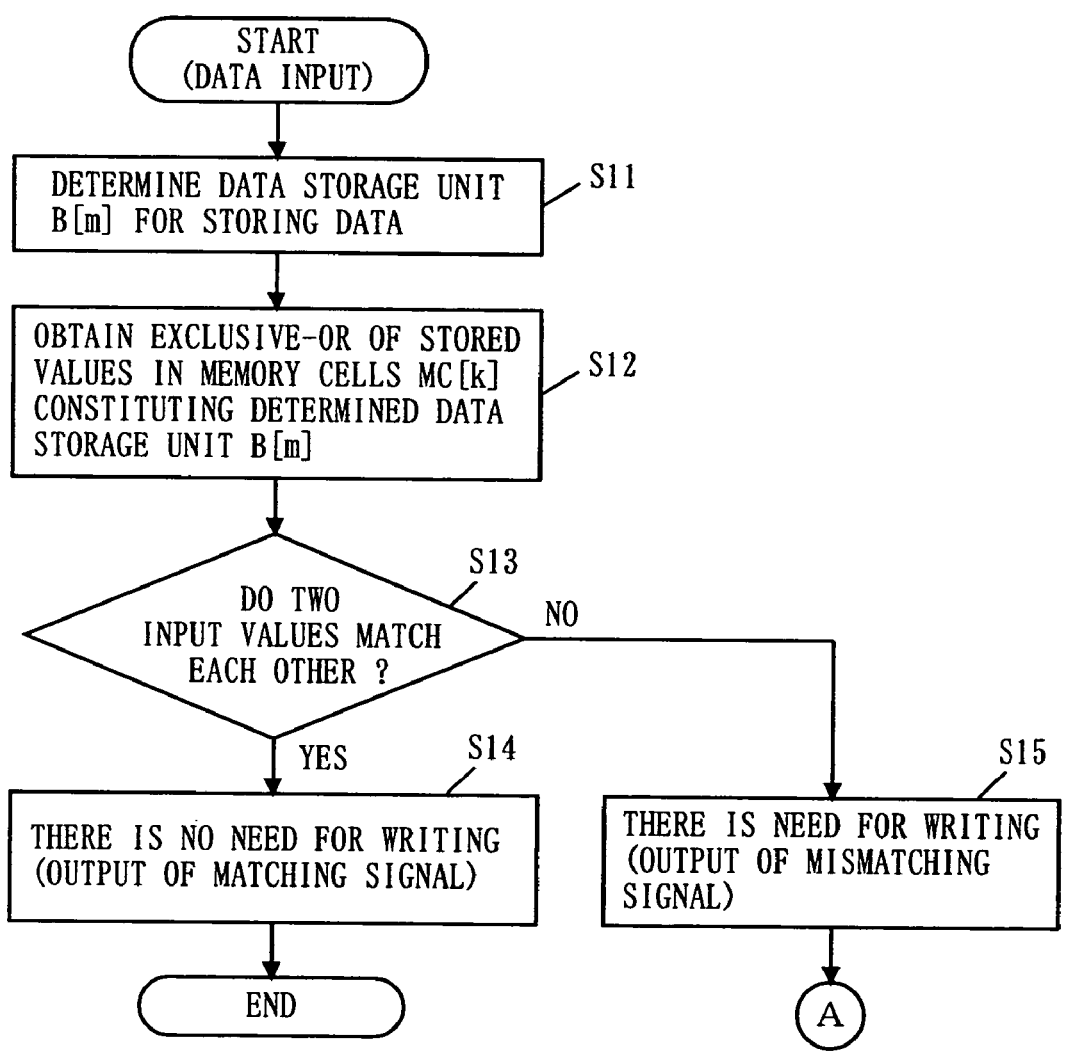
FIG. 3 is a flowchart showing processing performed by the control operation unit.
Figure 4:
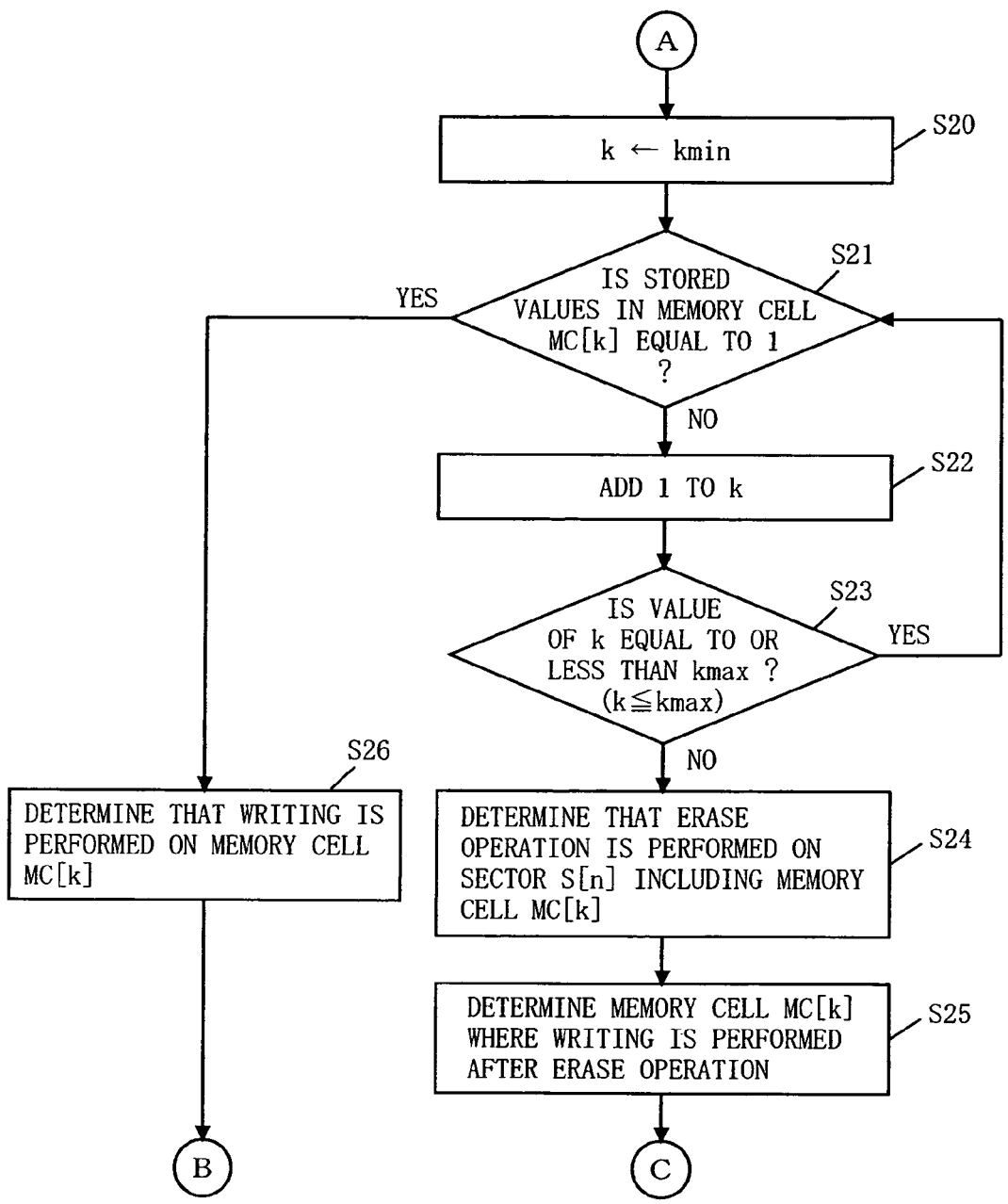
FIG. 4 is a continued flowchart of FIG. 3.
Figure 5:
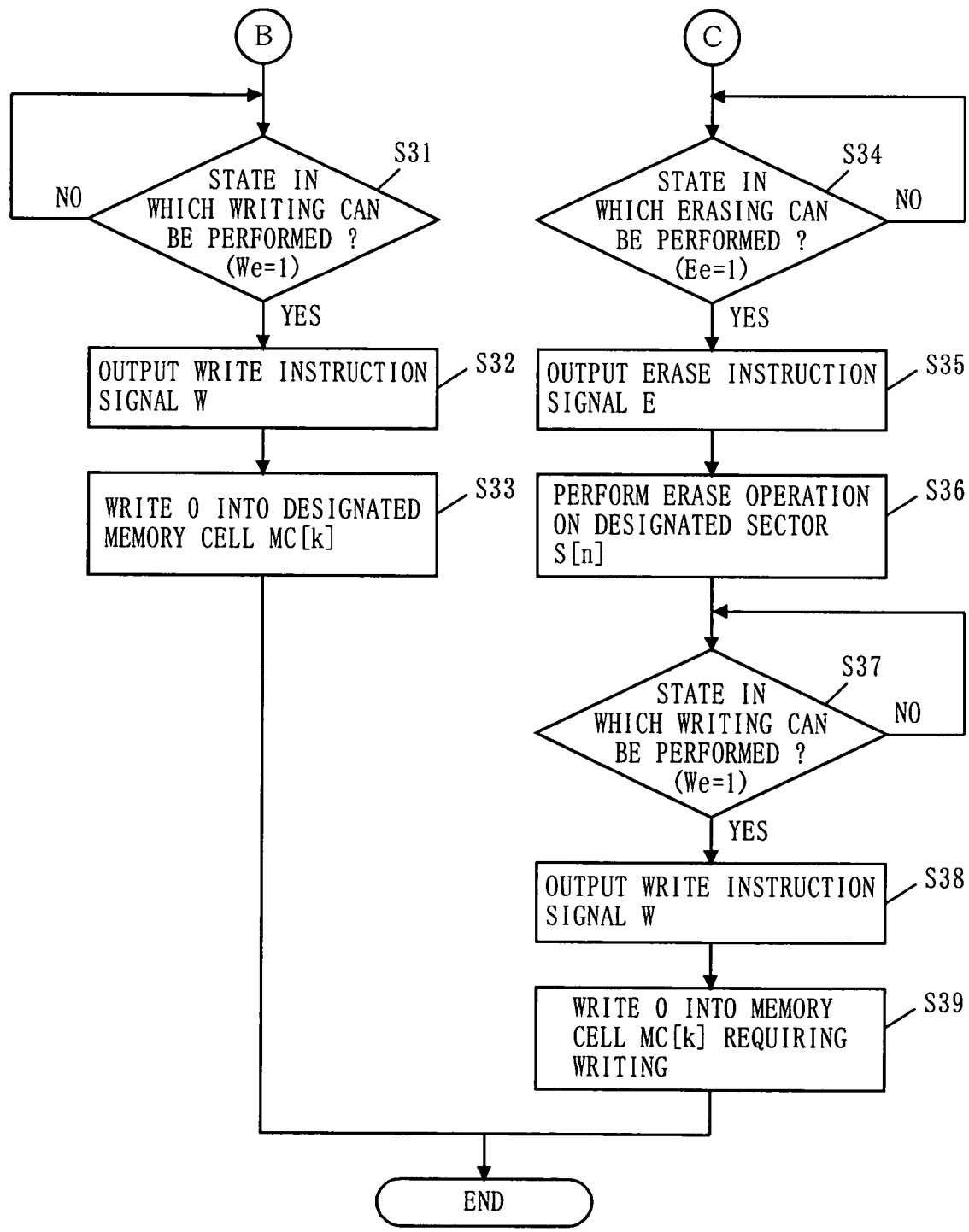
FIG. 5 is a continued flowchart of FIG. 4.

FIG. 2 is a block diagram mainly showing a configuration of the control operation unit 10 included in the semiconductor memory device 1 shown in FIG. 1. Moreover, FIGS. 3 to 5 are flowcharts showing processing carried out by the control operation unit 10 when data to be stored has been inputted. The configuration and operation of the semiconductor memory device 1 will be described below with reference to FIGS. 2 to 5.

As shown in FIG. 2, control operation unit 10 includes a readout control unit 11, a comparing unit 12, a rewrite cell determination unit 13, a rewrite control unit 14, and a logical operation unit 16. The stored values in all the memory cells MC[k] are 1 in their initial state and stored values in the data storage units B[m], which can be determined from the stored values in the memory cells MC[k], are 1 as well.

When data to be stored in the memory body 20 is inputted to the control operation unit 10 of FIG. 2, the readout control unit 11 determines the data storage units B[m] which store the data by the 1-bit data inputted (step S11 of FIG. 3). The readout control unit 11 outputs to the memory body 20 an address signal AD(k) indicating the positions of the three memory cells MC[k] included in the determined data storage units B[m], and a read instruction signal R.

The stored value in the three memory cells MC[k] are read to the rewrite cell determination unit 13 and the logical operation unit 16. The logical operation unit 16 has an exclusive-OR (XOR) operation circuit (not shown) which calculates the value of 1 when the number of the inputted 1 values is an odd number and which calculates the value of 0 when the number of the inputted 1 values is an even number. The logical operation unit 16 calculates an exclusive OR of the values inputted from the three memory cells MC[k] as a stored value in the data storage unit B[m] (step S12).

To the comparing unit 12, a 1-bit binary data value to be stored and the operational value calculated by the logical operation unit 16 are inputted. The comparing unit 12 compares the two inputted values. When the values mismatch each other (YES in step S13), the comparing unit 12 outputs a matching signal Ca which indicates that there is no need to rewrite the stored values in the data storage units B[m] (step S14), but when the values do not match each other (NO in step S13), the comparing unit 12 outputs a mismatching signal Cb which indicates that there is a need to rewrite the stored values in the data storage units B[m] (step S15).

To the rewrite cell determination unit 13, either the matching signal Ca or the mismatching signal Cb, and the stored values in the memory cells MC[k] constituting the data storage unit B[m] are inputted. When the matching signal Ca is inputted, the rewrite cell determination unit 13 determines to not perform rewriting.

On the other hand, when the mismatching signal Cb is inputted, the rewrite cell determination unit 13 determines whether the stored value in the memory cell MC[kmin] is equal to 1, wherein kmin is a minimum value of natural numbers k (steps S20 and S21 of FIG. 4). When the stored value in the memory cell MC[kmin] is 1 (YES in step 21), the rewrite cell determination unit 13 determines to perform writing to the memory cell MC[kmin] (step S26). Then, as shown in FIG. 2, the rewrite cell determination unit 13 outputs to the rewrite control unit 14 a write indication signal W' which indicates the writing and outputs to the memory body 20 address signals AD(k) which indicate the addresses of the memory cells MC[k] to which the writing is to be performed.

When the stored value in the memory cell MC[kmin] is 0 (NO in step S21), the rewrite cell determination unit 13 adds 1 to k (step S22) and then determines whether the value of k obtained after the addition (specifically, kmin+1) is equal to or less than kmax (step S23). In this case, kmax is a maximum value of k which denotes each memory cell MC[k] constituting the data storage units B[m] where the rewriting of the data is performed.

When the value of k is equal to or smaller than kmax (YES in step S23), the rewrite cell determination unit 13 determines whether the stored value in the memory cell MC[k] is 1. When the stored value is 1 (YES in step S21), the rewrite cell determination unit 13 determines to perform the writing to the memory cell MC[k] (step S26). Then the rewrite cell determination unit 13 outputs to the rewrite control unit 14 a write indication signal W' which provides an indication of the writing, and outputs to the memory body 20 an address signal AD(k) which indicate the address of the memory cell MC[k] to which the writing is to be performed.

When the value of k exceeds the value of kmax after an addition of 1 to k (NO in step S23), it is indicated that the stored values of all the memory cells MC[k] constituting the data storage unit B[m] are 0. In this case, the rewrite cell determination unit 13 determines to performing erase operation on the sector S[n] including the data storage unit B[m] where the stored values are to be rewritten (step S24 of FIG. 4).

When the rewrite cell determination unit 13 determines to perform the erase operation, the rewrite cell determination unit 13 reads stored values from the memory cells MC[k] of the other data storage units B[m] included in the sector S[n] where the erasing is to be performed, and then the exclusive-OR operation circuit (not shown) calculates stored values in the individual data storage units B[m]. And further, when there is any data storage unit B[m] whose stored value is 0, it is determined that writing is performed on the memory cell MC[kmin] among the memory cells MC[k] constituting the data storage unit(s) B[m] after the erase operation (step S25).

Moreover, the rewrite cell determination unit 13 outputs to the rewrite control unit 14 an erase indication signal E' which provides an indication of the erase operation, and outputs to the memory body 20 an address signal AD(k) which indicates the addresses of the memory cells MC[k] where the erase operation is to be performed. Then, the rewrite cell determination unit 13 outputs to the rewrite control unit 14 a write indication signal W' which provides an indication of writing to be performed after the erase operation and outputs to the memory body 20 an address signal AD(k) which indicate the address of the memory cell MC[k] to which the writing is to be performed.

To the rewrite control unit 14 shown in FIG. 2, a write enable signal We which is a strobe signal indicating the timing of the writing, an erase enable signal Ee which is a strobe signal indicating the timing of the erasing are inputted. Moreover, a forced write signal Eo and a forced erase signal Wo are inputted to the rewrite control unit 14 as well.

When the rewrite control unit 14 has received a write enable signal We having the value of 1 at the time of the input of a write indication signal W' and thus is in a state in which the writing of data to the memory cells can be performed (YES in step S31 of FIG. 5), the rewrite control unit 14 outputs a write instruction signal W to the memory body 20 (step S32).

On the other hand, when the rewrite control unit 14 has received a write enable signal We having the value of 0 at the time of the input of a write indication signal W' and thus is in a state in which the writing of data to the memory cells cannot be performed (NO in step S31), the rewrite control unit 14 waits until a state in which the writing can be performed is brought about (YES in step S31) and then outputs a write instruction signal W to the memory body 20 (step S32).

When receiving the write instruction signal W, the memory body 20 writes the value 0 to the memory cell MC[k] designated by the address signal AD(k) (step S33), whereby the stored values in the data storage unit B[m] are rewritten.

When the rewrite control unit 14 has received an erase enable signal Ee having the value of 1 at the time of the input of an erase indication signal E' and is in a state in which erasing can be performed (YES in step S34), the rewrite control unit 14 outputs an erase instruction signal E to the memory body 20.

On the other hand, when the rewrite control unit 14 has received an erase enable signal having the value of 0 at the time of the input of an erase indication signal E' and is not in a state in which erasing can be performed (NO in step S34), the rewrite control unit 14 waits until a state in which the erasing can be performed is brought about (YES in step S34) and then outputs an erase instruction signal E to the memory body 20 (step S35). When receiving the erase instruction signal E, the memory body 20 performs the erase operation on the sectors S[n] including the memory cells MC[k] designated by the address signal AD(k) (step S36).

Since the stored values in all the memory cells MC[k] included in the sectors S[n] become 1 by the erase operation, the rewrite control unit 14 waits until a state in which writing can be performed is brought about (step S37) and outputs a write instruction signal W (step S38). As a result, the writing is performed on the memory cell MC[k] where the execution of the writing is determined by the rewrite cell determination unit 13 after the erasing (step S39), whereby the stored value in the desired data storage unit B[m] is rewritten.

Also, when the rewrite control unit 14 has received a forced write signal Wo or a forced erase signal Eo, the rewrite control unit 14 performs write or erase operation to rewrite the stored values in the memory body 20.

And further, when the reading of the data stored in the memory body 20 is performed, the readout control unit 11 sends to the memory body 20 an address signal AD(k) indicating the positions of the three memory cells MC[k] of the data storage unit B[m] where it is desired that the reading of the stored value be performed and a read instruction signal R. Then the values stored in the three memory cells MC[k] are read from the memory body 20 to the logical operation unit 16. The logical operation unit 16 calculates the exclusive OR of the inputted three values, and then externally outputs the calculated value as a value which has been stored in the memory body 20.

Figure 6:
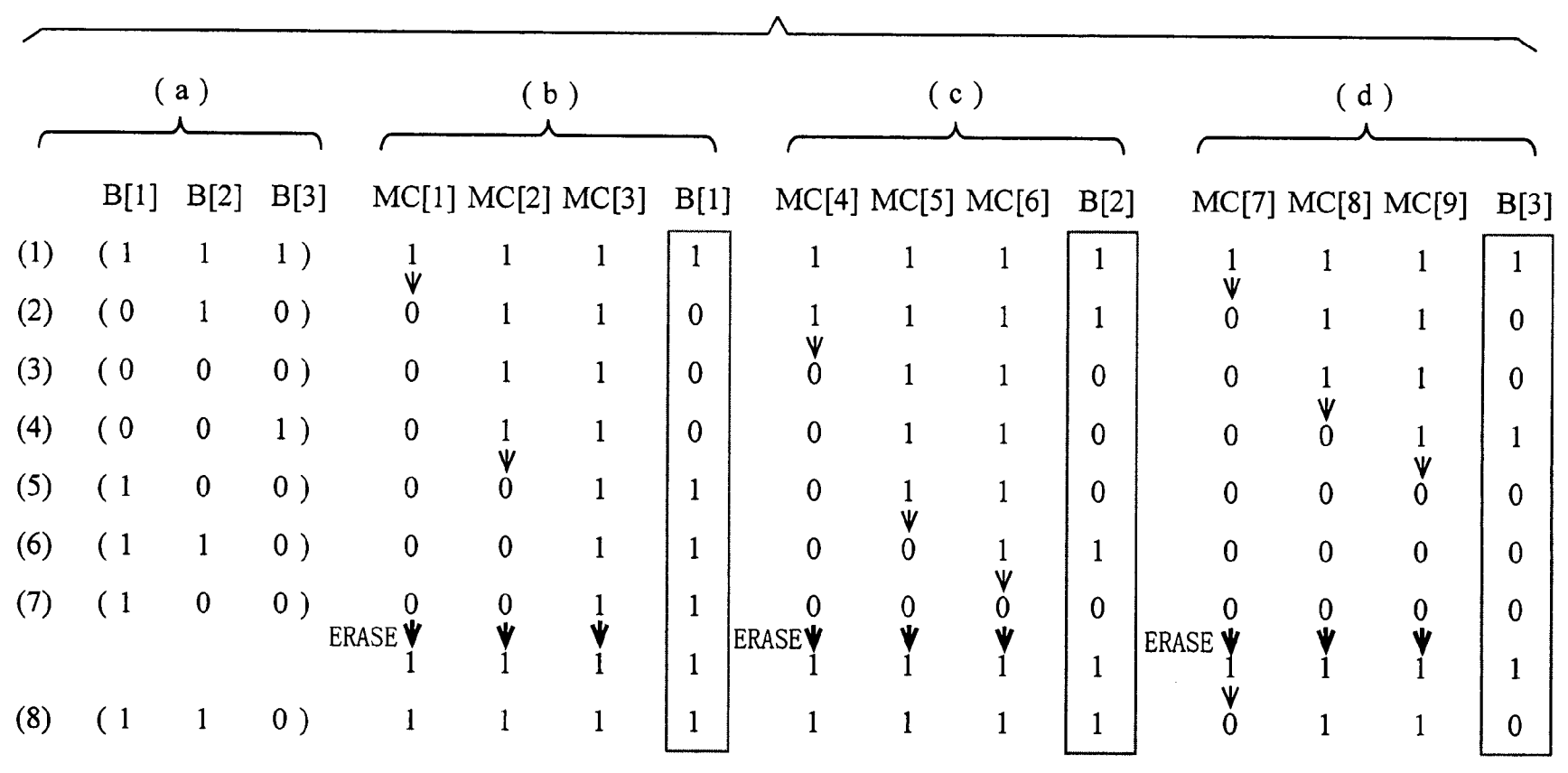

Next, the difference between the semiconductor memory device 1 according to the present embodiment and a conventional semiconductor memory device will be described with reference to FIGS. 6 and 7. In FIG. 6, column (a) represents a change in stored values in the data storage units B[1] to B[3] which constitute the sector S[1]. And further, column (b) represents the stored value in the data storage unit B[1] and stored values in the memory cells MC[1] to MC[3] which have been changed so as to be able to obtain the stored values given at column (a). Still further, columns (c) and (d) represent the stored values in the data storage units B[2] and B[3] and stored values in the memory cells MC[4] to MC[9] which have been changed to obtain the stored values given at column (a) as in the case of column (b).

Furthermore, FIG. 7 shows a change in stored values in the memory cells MC'[1] to MC'[3] of the conventional semiconductor memory device which stores 1-bit binary data in a 1-bit storage memory cell MC'[k] when the same values as those shown in FIG. 6(a) are stored. The memory cells MC'[1] to MC'[3] are in the same sector. In FIG. 7, column (a) corresponds to column (a) of FIG. 6, column (b) corresponds to columns (b), (c), and (d) of FIG. 6.

First, to change stored values in the memory body 20 from initial values (111) to (010) as shown in (1) and (2) of FIG. 6(a), data 0 is written to the memory cell MC[1] shown in FIG. 6(b) and to the memory cell MC[7] shown in FIG. 6(d). As a result, the stored values in the memory cells MC[1] to MC[3] and MC[7] to MC[9] each become values of (011) and the stored values in the data storage units B[1] and B[3] becomes 0. It should be noted that the stored values in the memory cells MC[1] to MC[3] cannot be rewritten because the stored value in the data storage unit B[2] is the same as the data value of 1 to be stored.

Next, as shown in (2) and (3) of FIG. 6(a), to change the stored value in the data storage units B[1] to B[3] from (010) to (000) data 0 is written to the memory cell MC[4] shown in FIG. 6(c). As a result, the stored value in the data storage unit B[2] becomes 0.

Next, as shown in (3) and (4) of FIG. 6(a), to change the stored value in the data storage units B[1] to B[3] from (000) to (001), data 0 is written to the memory cell MC[8] as shown in FIG. 6(d). As a result, the stored value in the data storage unit B[3] becomes 1.

Next, as shown in (4) and (5) of FIG. 6(a), to change the stored values in the data storage units B[1] to B[3] from (001) to (100), data 0 is written to the memory cells MC[2] and MC[9] as shown in FIGS. 6(b) and 6(d). As a result, the stored value in the data storage unit B[1] becomes 1, and the stored value in the data storage unit B[3] becomes 0.

Next, as shown in (5) and (6) of FIG. 6(a), to change the stored value in the data storage units B[1] to B[3] from (100) to (110), data 0 is written to the memory cell MC[5] as shown in FIG. 6(c). As a result, the stored value in the data storage unit B[2] becomes 1.

Next, as shown in (6) and (7) of FIG. 6(a), to change the stored value in the data storage units B[1] to B[3] from (110) to (100), data 0 is written to the memory cell MC[6]. As a result, the stored value in the data storage unit B[2] becomes 0.

Next, as shown in (7) and (8) of FIG. 6(a), to change the stored value in the data storage units B[1] to B[3] from (100) to (110), erase operation is performed on the sector S[1]. As a result, as shown in FIGS. 6(b) to 6(d), the data stored in the memory cells MC[1] to MC[9] is erased, whereby all the stored values are 1. Thereafter, verify processing is carried out in order to verify that the stored values in the memory cells MC[1] to MC[9] become 1. And then, as shown in FIG. 6(c), data 0 is written to the memory cell MC[7] in order to change the stored value in the data storage unit B[3] to 0.

Subsequently, rewriting performed in the conventional semiconductor memory device will be described with reference to FIG. 7. First, to change the stored values from (111) to (010) as shown in (1) and (2) of FIG. 7(a), data 0 is written to the memory cell MC'[3] as shown in FIG. 7(b).

Next, to change the stored value from (010) to (000) as shown in (2) and (3) of FIG. 7(a), data 0 is written to the memory cell MC'[2] as shown in FIG. 7(b).

Next, to change the stored value from (000) to (001) as shown in (3) and (4) of FIG. 7(a), the data stored in the memory cells MC'[1] to MC'[3] is initially erased as shown in FIG. 7(b). And then, verify processing is carried out in order to verify that all the stored values in the memory cells MC'[1] to MC'[3] become 1, following which data 0 is written to the memory cells MC'[1] and MC'[2] where there has been no need to change the stored values to 1.

Next, to change the stored value from (001) to (100) as shown in (4) and (5) of FIG. 7(a), the data stored in the memory cells MC'[1] to MC'[3] is erased as shown in FIG. 7(b). And then, after verify processing is carried out in order to verify that all the stored values in the memory cells MC'[1] to MC'[3] are 1, data 0 is written to the memory cells MC'[2] and MC'[3] where there has been no need to change the stored values to 1.

Next, to change the stored value from (100) to (110) as shown in (5) and (6) of FIG. 7(a), the data stored in the memory cells MC'[1] to MC'[3] is erased as shown in FIG. 7(b). And then, after verify processing is carried out in order to verify that all the stored values in the memory cells MC'[1] to MC'[3] are 1, data 0 is written to the memory cells MC'[3] where there has been no need to change the stored value to 1.

Next, to change the stored value from (110) to (100) as shown in (6) and (7) of FIG. 7(a), data 0 is written to the memory cell MC'[2] as shown in FIG. 7(b).

And finally, to change the stored value from (100) to (110) as shown in (7) and (8) of FIG. 7(a), the data stored in the memory cells MC'[1] to MC'[3] is erased as shown in FIG. 7(b). Then, after verify processing is carried out in order to verify that all the stored values in the memory cells MC'[1] to MC'[3] are 1, data 0 is written to the memory cell MC'[3] where there has been no need to change the stored value to 1.

As described above, in the rewriting to the semiconductor memory device 1 according to the present embodiment, the erase operation is performed only one time, whereas in the rewriting to the conventional semiconductor memory device, the erase operation is performed as much as four times. Since the lifetime of flash memory depends on the number of times erasing is performed, the number of rewriting to each memory cell MC[k] reduced by converting one bit of binary data to be stored to multiple bits of binary data for the storage as is the case with the semiconductor memory device 1 according to the present embodiment, whereby the memory body 20 can be used for a longer time.

And further, with regard to erasing, the rewriting of data takes more time than the writing of data because of necessity such as verify processing. However, since the number of erasing is performed can be reduced by the use of the semiconductor memory device 1 according to the present embodiment, rewriting time can be shortened.

Still further, in the semiconductor memory device 1 according to the present embodiment, rewriting is performed only when a stored value in the data storage unit B[m] and the value of data inputted do not match each other and therefore, needless rewriting can be eliminated. Therefore, the number of erasing can be reduced, whereby the memory body 20 can be used for a longer time. Besides, rewriting time can be reduced.

In addition, when rewriting stored values in the data storage units B[m], the rewrite cell determination unit 13 preferentially selects "writing" rather than "erasing" which shortens the lifetimes of the memory cells MC[k] and takes rewriting time. Moreover, for example, the stored value in the data storage unit B[m] obtained when the number of the memory cells MC[k] to which writing is performed is 1 is equal to that obtained when the number of the memory cells MC[k] to which the writing is performed is 3. When there are a plurality of rewriting methods, the rewrite cell determination unit 13 selects one of the rewriting methods in which the number of the memory cells MC[k] to which the writing is performed is as few as possible. As described above, the semiconductor memory device 1 is designed so that such processing which causes the deterioration of the memory body 20 is performed as little as possible and hence, the memory body 20 can be used for a longer time. And furthermore, rewriting time can also be shortened by reducing the number of times erasing is performed.

It should be noted that the number of the data storage units B[m] that constitute one sector S[n] and the number of the memory cells MC[k] that constitute one data storage unit B[m] are not limited to the numbers that have been used for the foregoing descriptions. In the semiconductor memory device 1, the fewer the number of the data storage units B[m] that constitute one sector S[n] is, the fewer the number erasing becomes, and the larger the number of the memory cells MC[k] that constitute one data storage unit B[n] is, the fewer the number of erasing becomes.

When the number of the memory cells MC[k] that constitute one data storage unit B[m] is an even number, a stored value in the data storage unit B[m] obtained when all stored values in the memory cells MC[k] are 0 (before erasing) and that obtained when all the stored values are 1 (after erasing) are the same value. Therefore, in a case where erasing is performed by the sector, by setting the number of the memory cells MC[k] that constitute one data storage unit to an odd number, a stored value in the data storage unit B[m] obtained after the erasing is different form that given before the erasing. Thus, there is no need to change the stored value in the data storage unit B[m] by performing additional writing after the erasing and hence, rewriting time can be shortened.

Although the description of the semiconductor memory device according to the present embodiment has been presented by taking flash memory as an example, the invention is useful for a semiconductor memory device which can be used for a longer time and bring about effect such as a shortened write time by reducing at least either the number of the writing from 0 to 1 or the number of the writing from 1 to 0. For example, since the lifetime of ferroelectric random access memory (FeRAM) depends on the number of rewriting, that is, the number of polarization inversions, the effect of prolonging their lifetime can be secured by applying the present invention to the memory.

And further, a memory other than the flash memory are used as well, rewriting time can be shortened provided that long-time rewrite processing can be performed by the batch and short-time rewrite processing can be performed individually compared to a case where short-time rewrite processing is performed by the batch and long-time rewrite processing is performed individually.

Furthermore, although the description of the semiconductor memory device according to the present embodiment has been presented by taking the 1-bit storage memory cells as an example. However, multivalued flash memory cells that each stores 2 bits or more of binary data may be used in the semiconductor memory device according to the present invention. For example, in multivalued memory cells that each stores 2 bits of binary data, first-bit storage in the first memory corresponds to the memory cell MC[1], and second-bit storage corresponds to the memory cell MC[2]. Then first-bit storage in the second memory cell corresponds to the memory cell MC[3], and second-bit storage corresponds to the memory cell MC[4].

The use of such multivalued memory cells makes it possible to reduce the number of the memory cells that constitute the data storage unit when compared with the use of the 1-bit storage memory cells. Therefore the use of the multivalued memory cells may make it possible to reduce the size of the semiconductor memory device when compared with the use of the 1-bit storage memory cells. Multivalued memories other than flash memories may be employed provided that the foregoing effect can be secured. For example, magnetoresistive random access memories (MRAMs) and ferroelectric random access memories (FeRAMs) may be employed.

Moreover, the semiconductor memory device according to the present invention is useful, for example, as a semiconductor memory device included in a system LSI. The present invention can be applied to a field programmable gate array (FPGA) and a configurable system LSI and the like.

In addition, the semiconductor memory device 1 according to the invention may comprise at least two separate components, such as a card that is the memory body and a device that performs the reading and rewriting of data from and to the card.

Second Embodiment

Figure 8:
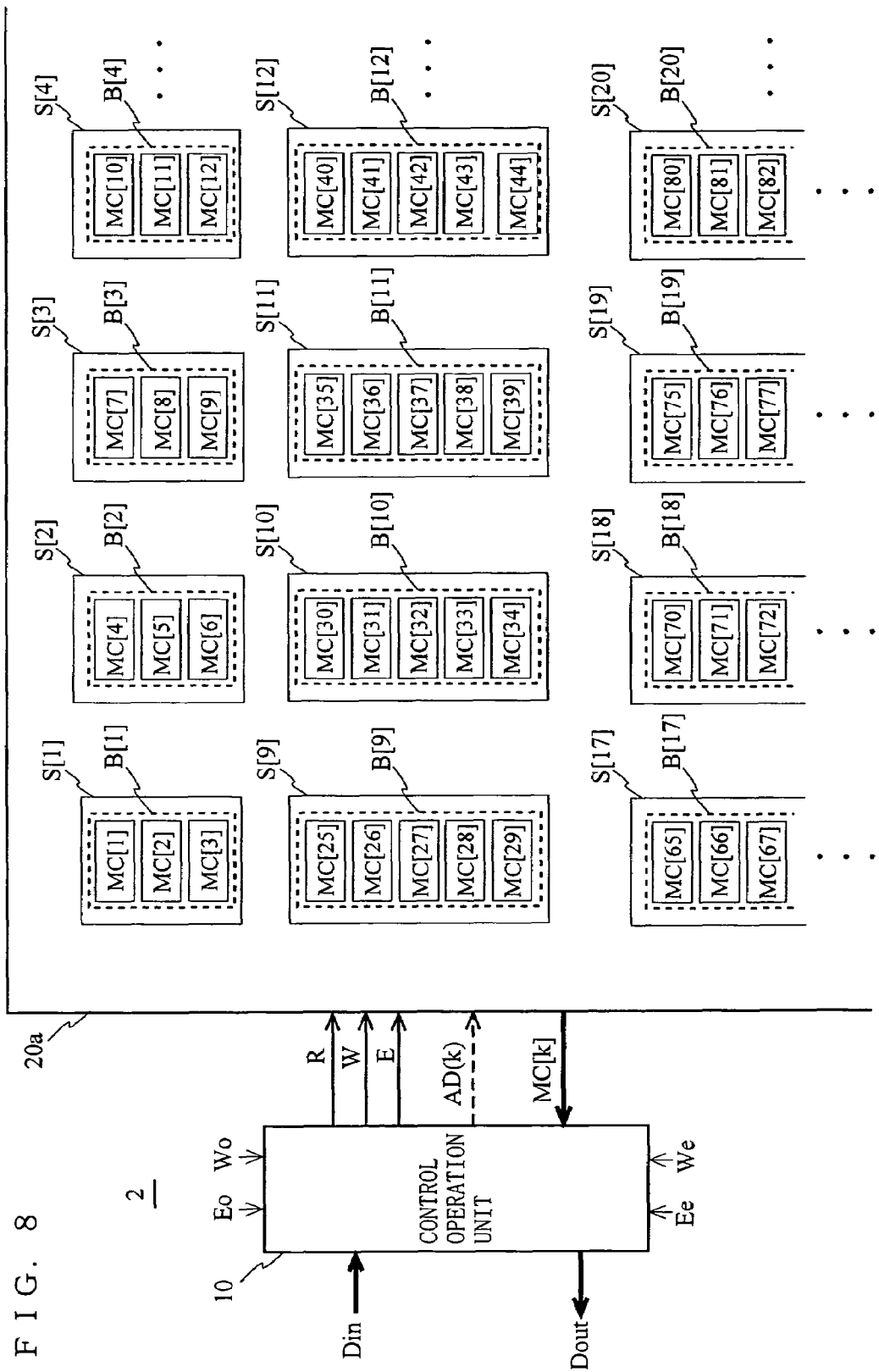
FIG. 8 is a block diagram of a semiconductor memory device according to a second embodiment of the invention.

FIG. 8 is a block diagram of a semiconductor memory device 2 according to a second embodiment of the present invention. The semiconductor memory device 2 includes the control operation unit 10 and a memory body 20a.

The memory body 20a includes a plurality of nonvolatile 1-bit storage memory cells MC[k] (k is a natural number) which are capable of continuing to hold stored data even after power has been turned off. In this embodiment as well, the memory body 20a will be described as a flash memory as in the case of that described in the first embodiment. And further, it is premised that a stored value in the memory cell MC[k], which is provided when the amount of electrons accumulated in the floating gate is equal to or larger than a predetermined amount, is 0 and a stored value in the memory cell MC[k], which is provided when the amount of the electrons accumulated in the floating gate is smaller than the predetermined amount, is 1. Although not shown in FIG. 8, the memory cells MC[k] are arranged in the memory cell arrangement region of the memory body 20a in the form of a matrix. In addition, the structure and operation of the control operation unit 10 included in the semiconductor memory device 2 according to the invention are the same as those described in the first embodiment and therefore, their description will be omitted.

One data storage unit B[m] (m is a natural number) includes three or five memory cells MC[k]. For example, the data storage unit B[1] includes the three memory cells MC[1] to MC[3], and the data storage unit B[9] includes the five memory cells MC[25] to MC[29]. And further, one data storage unit B[m] forms one sector S[n] (n is a natural number). The memory cells MC[k] present in the same sector S[n] are connected to the same word line (voltage supply line).

Figure 9:
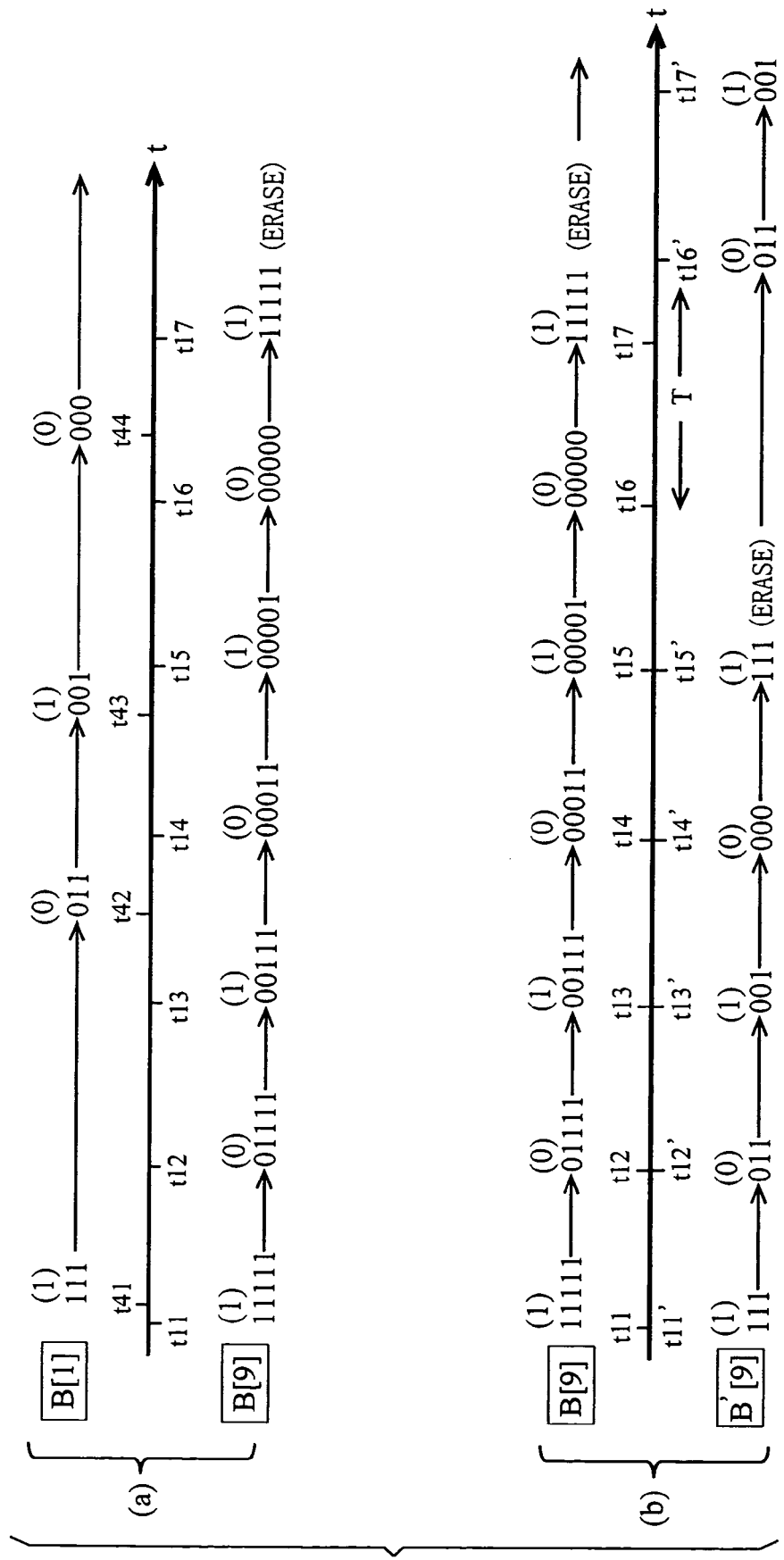
FIG. 9 is a diagram showing change in stored values in data storage units B[1], B[9], and B'[9] in time sequence.

Next, the rewriting of data performed in the semiconductor memory device 2 will be described with reference to FIG. 9. FIG. 9(a) shows the rewriting of data performed in the data storage units B[1] to B[9]. Times t41 to t44 shown in FIG. 9(a) are times when a stored value in the data storage unit B[1] is rewritten in order of "1, 0, 1, 0". And furthermore, times t11 to t17 shown in FIG. 9(a) are times when a stored value in the data storage unit B[9] is rewritten in order of "1, 0, 1, 0, 1, 0, 1".

In the semiconductor memory device 2, each sector S[n] is formed by one of the data storage units B[m] and therefore, as shown in FIG. 9(a), the stored values in the data storage units B[m] of the semiconductor memory device 2 is separately rewritten at the individual data storage units B[m].

If the stored values are rewritten by the data storage unit B[m], erasing the data stored in one of the data storage units B[m] does not cause the data stored in the other data storage units B[m] to be erased. Therefore the use of the semiconductor memory device 2 makes it possible to reduce the number of erasing as compared with conventional semiconductor memory devices, whereby the memory body 20b can be used for a longer time.

Moreover, in the semiconductor memory device 2, the data storage units B[m] having large number of the memory cells MC[k] is assigned to a data type frequently rewritten so that the memory can be used for a still longer time. For example, as shown in FIG. 9(a), since the stored data in the data storage unit B[9] is frequently rewritten as compared with the stored data in the data storage unit B[1], the data storage unit B[9] includes more memory cells MC[k] than the data storage unit B[1].

FIG. 9(b) shows the difference between the timing of the rewriting of the stored value in the data storage unit B[9] having the five memory cells MC[k] and that of the rewriting of the stored value in the data storage unit B'[9] having the three memory cells MC[k] when the same rewriting is performed.

Reference signs t11 to t17 shown in FIG. 9(b) denote rewriting times at the data storage unit B[9], and reference signs t11' to t17' denote rewriting times at the data storage unit B'[9]. As shown in FIG. 9(b), the erasing of data at the data storage unit B[9] including large number of the memory cells MC[k] is performed in the later rewriting stage as compared with that in the data storage unit B'[9] including small number of the memory cells MC[k].

Therefore, when the rewriting of data has been repeated, the larger the number of the memory cells MC[k], the smaller the number of erasing, thereby the memory body 20 can be used for a longer time. When erasing is performed, it becomes necessary to carry out verify processing after the erasing, whereby it takes longer time period to rewrite data than to write data. Therefore, when data to be frequently rewritten is identified, the memory can be used for a longer time by storing the data in the data storage units B[m] including large number of the memory cells MC[k] and rewriting time can be reduced.

It should be noted that the memory cells according to the present embodiment may be multivalued memory cells that are each capable of storing multibit data.

Third Embodiment

Figure 10:
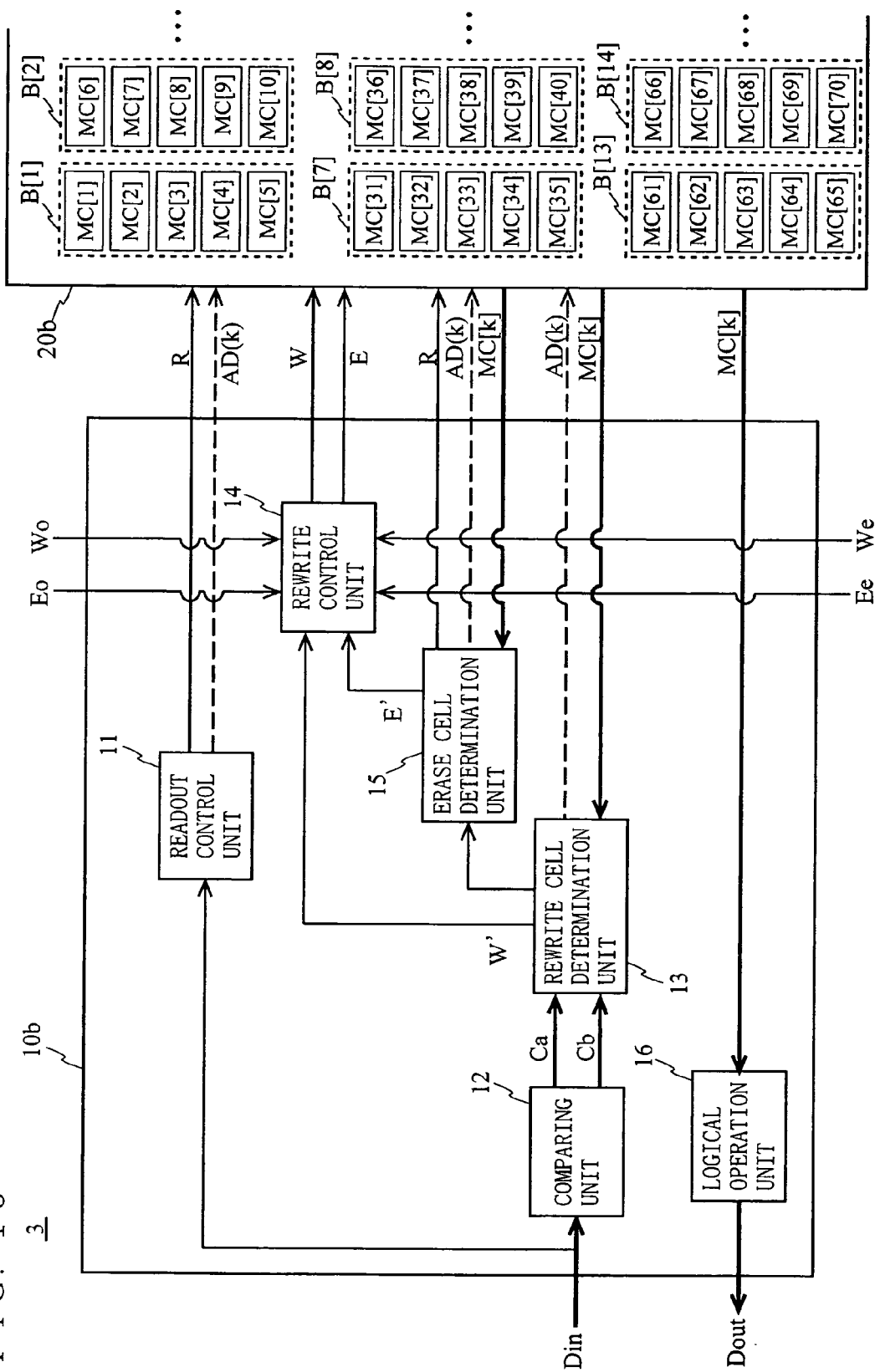
FIG. 10 is a block diagram of a semiconductor memory device according to a third embodiment of the invention.

FIG. 10 is a block diagram of a semiconductor memory device 3 according to a third embodiment of the invention. The semiconductor memory device 3 includes a control operation unit 10b and a memory body 20b.

The memory body 20b includes a plurality of nonvolatile 1-bit storage memory cells MC[k] (k is a natural number) that are capable of continuing to hold stored data even after power has been turned off. The present embodiment under the assumption that the memory body 20b is a flash memory as in the case of those described in the first and second embodiments. Although not shown in FIG. 10, the memory cells MC[k] are arranged in the memory cell arrangement region of the memory body 20b in the form of a matrix.

The data storage units B[m] (m is a natural number) each includes five memory cells MC[k]. In the semiconductor memory device 3 according to the present embodiment, the control of gate voltage is not exercised sector by sector and erasing is performed memory cell by memory cell MC[k].

The control operation unit 10b includes the readout control unit 11, the comparing unit 12, the rewrite cell determination unit 13, the rewrite control unit 14, and the erase cell determination unit 15. In this embodiment, processing carried out at the control operation unit 10b will be described with an emphasis on processing carried out at the erase cell determination cell 15 that is a component unique to the semiconductor memory device according to the present embodiment. The description on processing carried out at components other than the component above will be omitted because the processing is the same as that described in the first embodiment.

Figure 11:
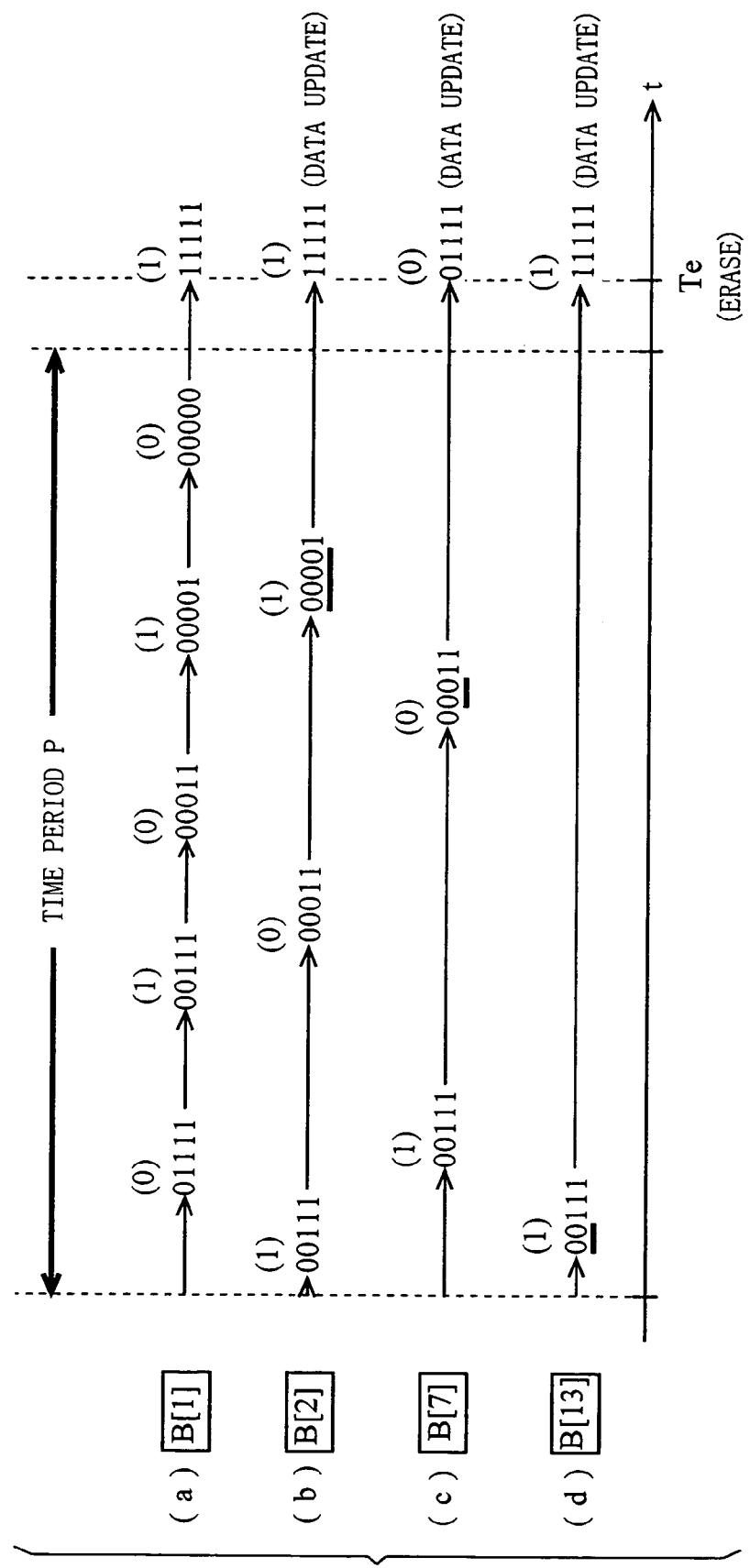
FIG. 11 is a diagram for use in the description of rewrite processing.

The rewriting of data to the semiconductor memory device 3 will be described with reference to FIG. 11. FIG. 11(a) shows the rewriting of data to the data storage unit B[1] in time sequence, FIG. 11(b) shows the rewriting of data to the data storage unit B[2], FIG. 11(c) shows the rewriting of data to the data storage unit B[7], and FIG. 11(d) shows the rewriting of data to the data storage unit B[13].

As shown in FIG. 11(a), the stored value in the data storage unit B[1] is rewritten in the order of "0, 1, 0, 1, 0" during a time period P. In addition, all stored values in the memory cells MC[1] to MC[5] become 0 after the last rewriting during the time period P. Then erase operation is performed on the memory cells MC[1] to MC[5] at the time of the next rewriting performed at time Te.

The memory cells MC[1] to MC[5] do not form a sector and thus, by erasing the data stored in the memory cells MC[k] one by one, it is also possible to change the stored value in the data storage unit B[m]. However, in the semiconductor memory device 3, the other processing operations cannot be performed during the erase operations and therefore, when the stored value in the data storage unit B[m] is changed by the erasing, the erase operations are concurrently performed on all the memory cells MC[k] within the data storage unit B[m].

As shown in FIG. 11(b), the stored value in the data storage unit B[2] is rewritten in the order of "1, 0, 1" during the time period P. In addition, stored values in the memory cells MC[6] to MC[10] become (00001) after the last rewriting performed during the time period P.

As shown in FIG. 11(c), the stored value in the data storage unit B[7] is rewritten in the order of 1, 0 during the time period P. In addition, stored values in the memory cells MC[31] to MC[35] become (00011) after the last rewriting performed during the time period P.

As shown in FIG. 11(d), a stored value in the data storage unit B[13] is 1 and stored values in the memory cells MC[61] to MC[65] are (00111) during the time period P.

As previously described, during erase operation, the other processing operations such as writing cannot be performed. Therefore, when erase operation is performed to rewrite stored values in the data storage units B[m], erase operation is performed on part of or all of the memory cells MC[k] of the data storage units B[m] where stored values need not be rewritten, thereby reducing the number of the erase operations performed with different timings.

More specifically, as shown in FIG. 11(b), erase operation is performed on the four memory cells MC[6] to MC[9] with the stored value of 0 included in the data storage unit B[2] at the time Te, that is, with a timing when erase operation is performed on the data storage unit B[1]. At the result, the stored value in the memory cells MC[6] to MC[10] become (11111). The stored value in the data storage unit B[2] after the erase operation is 1 as is the case with that before the erase operation. Such rewriting performed without changing the stored values in the data storage units B[m] is hereinafter referred to as "data update".

Data update is also performed on the data storage units B[7] and B[13]. As shown in FIG. 11(c), erase operation is performed on the two memory cells MC[32] and MC[33] whose stored values are 0 in the data storage unit B[7] at the time Te.

In addition, as shown in FIG. 11(d), erase operation is performed on the two memory cells MC[61] and MC[62] whose stored values are 0 in the data storage unit B[13] at the time Te.

As described above, by performing erase operation on a certain data storage unit B[m] concurrently with erase operation on even numbers of the memory cells MC[k] whose stored values are 0 in another data storage unit B[m], time can be gained until the next erase operation and hence, rewriting time taken at the semiconductor memory device 3 can be shortened.

The memory cells MC[k] to be erased are determined by the erase cell determination unit 15 shown in FIG. 10. Specifically, when the memory cell MC[k] in the data storage unit B[m] where the stored value is to be changed is determined by the rewrite cell determination unit 13, the unit 13 outputs a signal to the erase cell determination unit 15.

When receiving the signal from the rewrite cell determination unit 13, the erase cell determination unit 15 reads stored values from the memory body 20b and determines the memory cells MC[k] where stored data is to be erased at one time. Then the erase cell determination unit 15 outputs an erase indication signal E' to the rewrite control unit and outputs an address signal, which indicates the addresses of the memory cells MC[k] to be erased, to the memory body 20b.

When receiving the erase indication signal E', the rewrite control unit 14 outputs an erase instruction signal E to the memory body 20b with a timing the erasing can be performed. At the memory body 20 that has received the erase instruction signal E, erase operations are simultaneously performed on the memory cells MC[k] with the designated addresses.

In the semiconductor memory device 3, the number of the erase operations performed with different timings can be reduced by performing "data update" on the data storage units where there is no need to change the stored values, which makes it possible to shorten rewriting time. Therefore, according to the semiconductor memory device 3, higher-speed writing can be implemented. Although the lifetime of the memory body 20b of the semiconductor memory device 3 according to the present embodiment may be shorter than that of the memory body according to the first embodiment to some extent. However, since the data is stored by converting one bit of data values to multiple bits of data, the lifetime of the memory body 20b of the semiconductor memory device 3 becomes longer than those of conventional memory bodies.

The erase cell determination unit 15 determines the memory cells MC[k] to be erased based on whether the data therein should be periodically rewritten, or based on a time period required until the next rewriting, the frequency of rewriting, etc.

In FIG. 11(c), among the memory cells MC[31] to MC[35] of the data storage unit B[7], erase operation is performed on the two memory cells MC[32] and MC[33] into which 0 has been written immediately before the erasing. However, the memory cells where the erase operation is performed may be any of the memory cells MC[31] to MC[33] if the stored value in the data storage unit B[m] before the erase operation (before the data update) is equal to that after the erase operation (after the data update). In a case where data update is performed to shorten rewriting time as well, if erase operation is not intensively performed on particular memory cells MC[k], the average number of the erasing on each memory cell does not increase extremely, whereby the memory body 20b can be used for a long time.

In the first embodiment, to determine a memory cell MC[k] included in a sector S[n] to which writing is performed after erase operation, the rewrite cell determination unit 13 reads the storage values in the memory cells MC[k] from the memory body 20 and calculates the stored value in the data storage unit B[m]. However, in the semiconductor memory device 3 according to the present embodiment, the rewrite cell determination cell 13 does not have to perform writing after erasing because no sector S[n] is formed.

Fourth Embodiment

Figure 12:
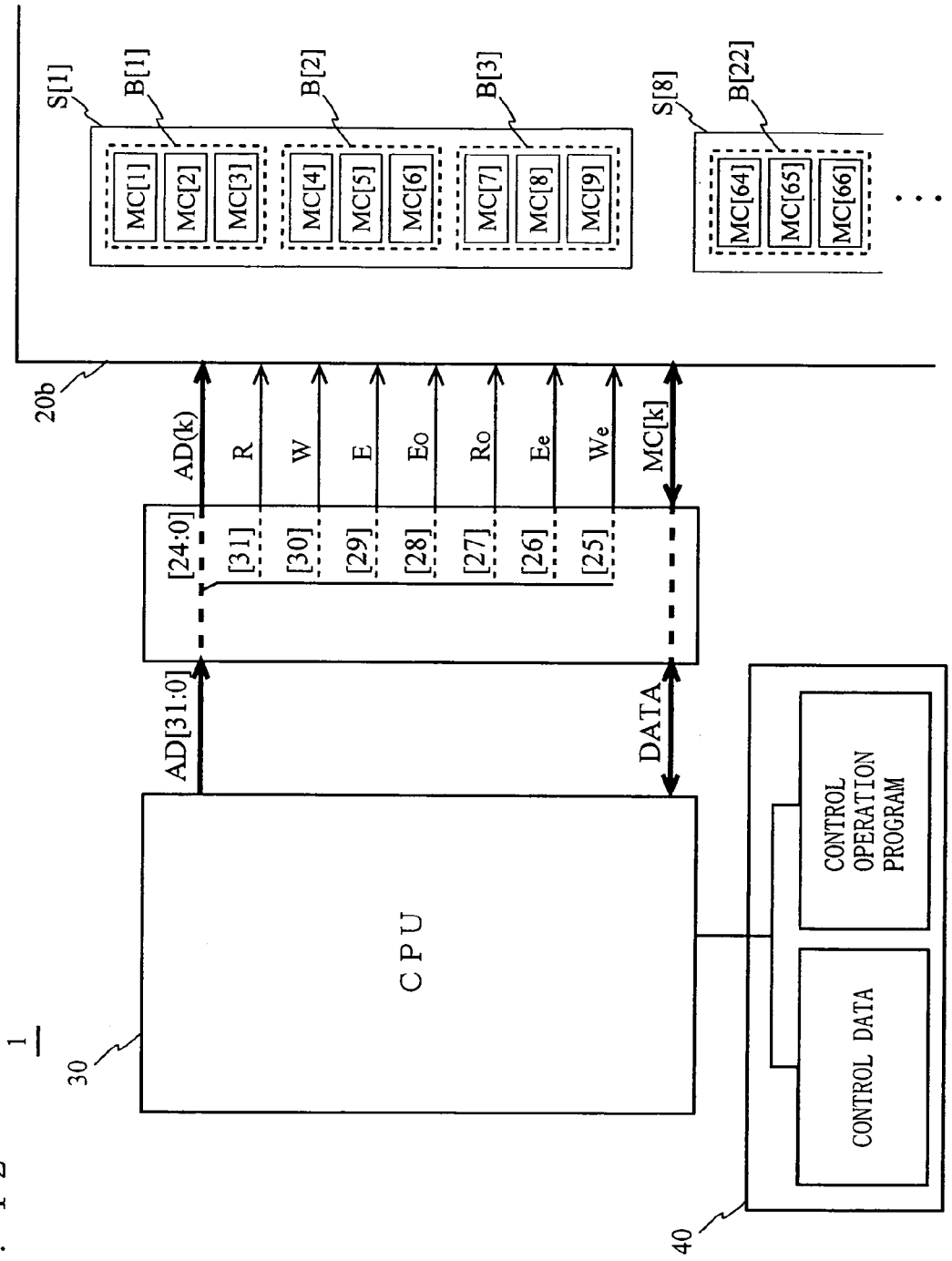
FIG. 12 is a block diagram of a semiconductor memory device that executes a program according to a fourth embodiment of the invention.

FIG. 12 is a block diagram of a semiconductor memory device provided with a program for executing the same processes as those performed by the semiconductor memory device described in the first embodiment. The semiconductor memory device according to the fourth embodiment includes a CPU 30, a storage unit 40, and the memory body 20b. The CPU 30 and the memory body 20b are coupled with each other by using a piece of hardware or a connecting status therebetween can be changed via a FPGA (field programmable gate array). The memory body 20b is the same as that described in the first embodiment and therefore, its detail description will be omitted. An address AD(k) is given to the memory cell MC[k] included in the memory body 20b.

The storage unit 40 is a memory, which is not rewritten, for storing a control operation program and control data to which the CPU 30 refers when rewriting data stored in the memory body 20b. In this case, the control operation program includes a readout control program P1 which is an ordinary readout program P1, a rewrite cell determination program P2 for determining a cell to be rewritten, a rewrite control program P3 for executing a control of rewriting data stored in the memory cells MC[k], a comparison program P4 for performing data comparison, and a logical operation program P5 for calculating data to be read. The readout control program P1, the rewrite cell determination program P2, the rewrite control program P3, the comparison program P4, and the logical operation program P5 are programs used for performing the same processing operations as those performed by the readout control unit 11, the rewrite cell determination unit 13, the rewrite control unit 14, the comparing unit 12, and the logical operation unit 16 described in the first embodiment and shown in FIG. 2, respectively. In addition, the control data includes data necessary for executing the control operation program.

Figure 13:
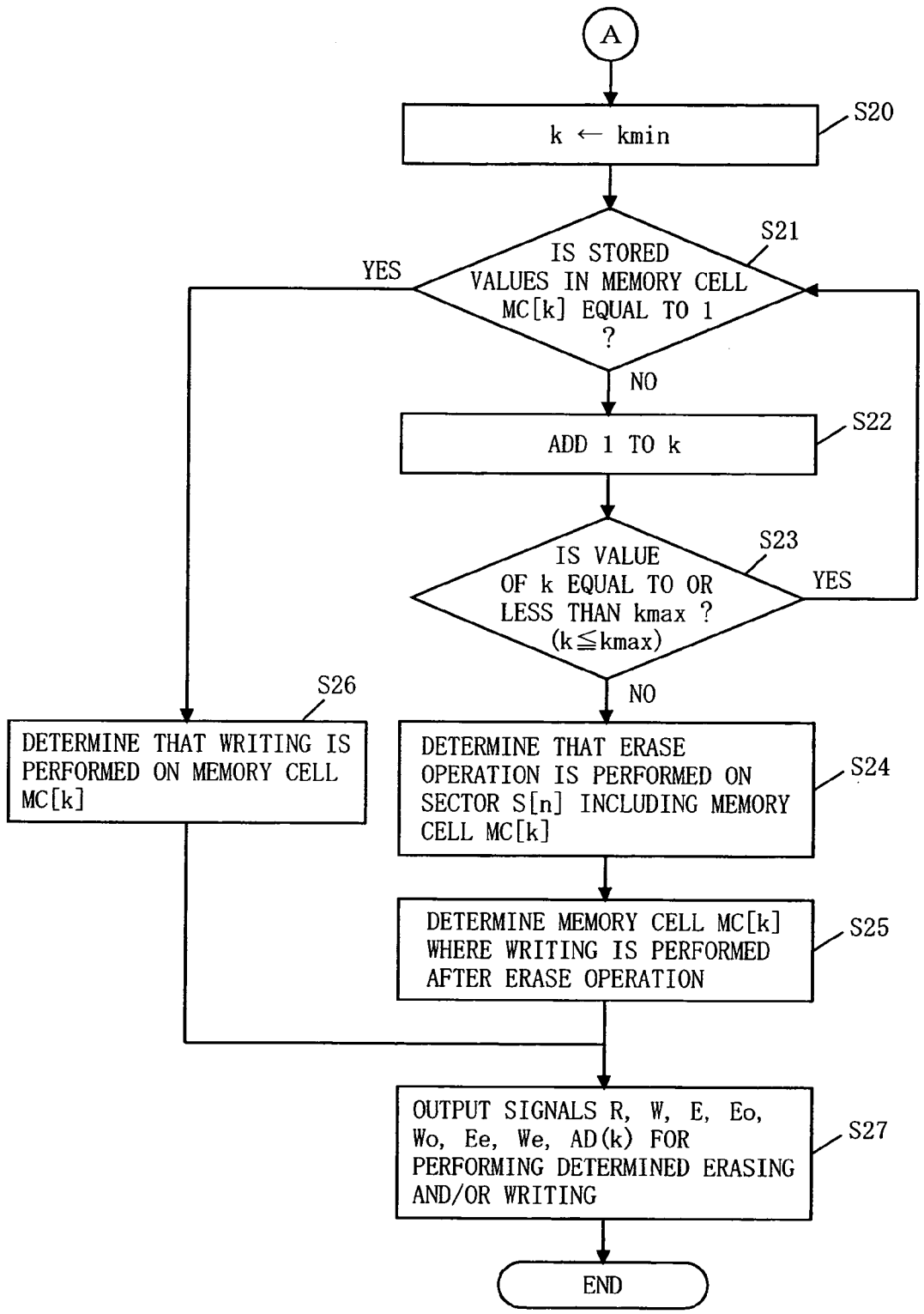
FIG. 13 is a continued flowchart of FIG. 3 showing processing performed by executing the program.

When data to be stored is inputted, the CPU 30 reads the program held in the storage unit 40 and performs the following processing shown in the flowcharts of FIGS. 3 and 13. The 7 higher-order bits of an address signal outputted from the CPU 30 represent a readout indication signal R, a write indication signal W, an erase indication signal E, a forced erase signal Eo, a forced write signal Wo, an erase enable signal Ee, and a write enable signal We. Remaining 25 bits represent address signals AD(k) for the memory cells MC[k] where stored data is rewritten. In their initial state, stored values in all the memory cells MC[k] are 1 and stored values in the data storage units B[m], which can be determined from the stored values in the memory cells MC[k], are 1 as well.

When data to be stored in the memory body 20b has been inputted to the semiconductor device, the CPU 30 executes the readout control program P1 and determines the data storage units B[m] for storing the data for each 1-bit of the input data (step S1 of FIG. 3).

Next, the CPU 30 executes the logical operation program P2 using the stored values in the q pieces (q is an odd number. In the case of FIG. 12, q=3) of memory cells MC[k] which constitute the determined data storage unit B[m] and calculates the exclusive OR (XOR) of the stored values in the q pieces of memory cells MC[m] as the stored value in the data storage unit B[m] (step S12). More specifically, when the number of the memory cells MC[k] storing data "1" is odd, the values "1" is calculated as the stored value in the data storage unit B[m] and when the number is even, the value "0" is calculated as the stored value.

After the stored values in the data storage unit B[m] is calculated, the CPU 30 executes the comparison program P4 to compare a 1-bit binary data value to be stored and the stored value figured out. When they match each other (YES in step S13), there is no need to rewrite the stored value in the data storage unit B[m] (step S14), and therefore, in this case, rewriting is not performed. In contrast, when they do not match each other (NO in step S13), there is a need to rewrite the stored value in the data storage unit B[m] (step S15).

When there is a need for the rewriting, the CPU 30 executes the rewrite cell determination program P2 to determine the memory cell MC[k] to be rewritten. More specifically, the CPU 30 initially determines whether the stored value in the memory cell MC[kmin] (kmin is a minimum value of natural numbers ks) is 1 (steps S20 and S21 of FIG. 13). When the stored value in the memory cell MC[kmin] is 1 (YES in step S21), the rewrite cell determination cell 13 determines to write data to the memory cell MC[kmin] (step S26).

On the other hand, when the stored value in the memory cell MC[kmin] is 0 (NO in step S21), the CPU 30 adds 1 to k (step S22) and determines whether the value k obtained after the addition (specifically, kmin+1) is equal to or smaller than kmax (step S23). In this case, kmax is a maximum value of natural numbers ks which indicate the positions of the memory cells MC[k] which constitute the data storage unit B[m] to be rewritten.

When the value k is equal to or smaller than kmax (YES in step S23), the CPU 30 determines whether the stored value in the memory cell MC[k] is 1. When the stored value is 1 (YES in step S21), the CPU 30 determines to write data to the memory cell MC[k] (step S26).

When the value k has exceeded kmax by adding 1 to k (NO in step S23), the stored values in all the memory cells MC[k] constituting the data storage unit B[m] is 0. In this case, the rewrite cell determination unit 13 determines to perform an erase operation on the sectors S[n] including the data storage unit B[m] to be rewritten (step S24 of FIG. 4).

When determining to perform the erase operation, the CPU 30 executes the readout control program P1 to read the stored values in the memory cells MC[k] from the other data storage unit B[m] included the sector S[n] to be erased. Then the CPU 30 executes the logical operation program P5 to calculate the stored value in the individual data storage units B[m]. As a result, when there is the data storage unit B[m] which stores value 0, the CPU 30 determines to write data to the memory cell MC[kmin] among the memory cells MC[k] constituting the data storage unit B[m] after the erase operation (step S25).

Thereafter, to perform any one of the determined erasing and the writing or both, the CPU 30 outputs a readout instruction signal R, a write instruction signal W, an erase instruction signal E, a forced erase signal Eo, a forced write signal Wo, an erase enable signal Ee, a write enable signal We, and an address signal AD(k) (step S27). As a consequence, the stored values in the desired data storage units B[m] can be rewritten.

When the data stored in the memory body 20b is read, the CPU 30 executes the readout program P1 to read the stored values in the q pieces of memory cells MC[k] in the data storage unit B[m] to be read. Then, the CPU 30 executes the logical operation program P5 to calculate the exclusive OR of the q pieces of read values, and externally outputs the calculated value as the value stored in the memory body 20b.

As in the case of the semiconductor memory device described in the first embodiment, the execution of the program according to the present embodiment makes it possible to obtain the effects of allowing the memory body 20b to be used for a longer time, and shortening a time required for the rewriting, etc.

To perform the processing described in the third embodiment, the storage unit 40 may store a erase cell determination program P6 for performing the same processes as those performed by the erase cell determination unit 15 shown in FIG. 10. After the erase operation is determined at step S24 of FIG. 13, the erase cell determination program P6 may be executed to determine the memory cells MC[m] to be erased at one time among the other memory cells MC[k]. In this case, whether the memory cells MC[m] are desired to be erased at one time may be determined based on whether the data thereof needs to be periodically rewritten, or based on a time period taken until the next rewriting, the frequency of rewriting, etc.

INDUSTRIAL APPLICABILITY

The semiconductor memory device according to the present invention is useful as a nonvolatile memory device and, more specifically, is also useful as a semiconductor memory device incorporated in a system LSI and the like. And furthermore, the semiconductor memory device can also be applied to a FPGA and a configurable system LSI and the like.

The invention claimed is:

1. A semiconductor memory device including a plurality of memory cells each having two or more storage statuses, a rewrite speed or a degree of deterioration of the memory cells varying depending on which one of the storage statuses is caused by rewriting, the device comprising:
    a memory body including a plurality of data storage units, each of which has a plurality of the memory cells and stores a value of one bit;
    a read/rewrite control unit for performing a process of reading stored values in the memory cells, and a process of rewriting the stored values in the memory cells;
    an operation unit for performing an operation with the stored values in the memory cells which constitute the determined data storage unit to obtain a stored value in the data storage unit;
    a comparing unit for comparing the stored value in the data storage unit obtained by the operation unit and an externally inputted value and outputting a signal indicating matching or mismatching therebetween; and
    a rewrite cell determination unit for determining the memory cell whose stored value needs to be changed such that the stored value in the data storage unit is equal to the externally inputted value when the comparing unit outputs the signal indicating the mismatching.

2. The semiconductor memory device according to claim 1, wherein
the operation unit includes an exclusive-OR circuit.

3. The semiconductor memory device according to claim 2, wherein
each of the data storage units has a capacity for storing three or more odd bits of data.

4. The semiconductor memory device according to claim 1, wherein
the number of the memory cells included in each of the individual data storage units differs depending on each of the data storage units.

5. The semiconductor memory device according to claim 1, wherein
the read/rewrite control unit changes the stored values in the data storage units by performing either one of the processes:
an individual rewrite process of rewriting the stored values in the memory cells for each of the memory cells; and
a batch rewrite process of rewriting the stored values in the memory cells for each one or more of the data storage units.

6. The semiconductor memory device according to claim 5, wherein
the memory body is a flash memory,
the individual rewrite process represents a write process, and
the batch rewrite process represents an erase process.

7. The semiconductor memory device according to claim 5, wherein,
when a time period required for a first rewriting of rewriting the stored value in the memory cell to the value of either 0 or 1, is shorter than a time period required for a second rewriting of rewriting the stored value in the memory cell to the other value,
the first rewriting is performed in the individual rewrite process, and
the second rewriting is performed in the batch rewrite process.

8. The semiconductor memory device according to claim 7, further comprising
a specific rewrite cell determination unit for determining the memory cells which are included in a data storage unit where there is no need to change the stored values thereof and have a capacity for storing even bits of data to be written in the second rewriting, wherein
the read/rewrite control unit rewrites each of the stored values in the memory cells determined by the specific rewrite cell determination unit when the batch rewrite processing is performed.

9. The semiconductor memory device according to claim 1, wherein
each of the memory cells is a multivalued memory cell having a capacity for storing multiple bits of data.

10. A rewrite processing method for rewriting a semiconductor memory device including a plurality of memory cells each having two or more storage statuses, a rewrite speed or a degree of deterioration of the memory cells varying depending on which one of the storage status is caused by rewriting, the method comprising:
determining, among a plurality of data storage units, each of which has a plurality of the memory cells and stores a value of one bit, one of the data storage units so as to store externally inputted data;
performing an operation with the stored values in the memory cells which constitute the determined data storage unit to obtain a stored value in the data storage unit;
comparing the stored values in the data storage unit obtained by the operation and the externally inputted value to determine whether both values match each other;
determining the memory cell whose stored value needs to be changed such that the stored value in the data storage unit is equal to the externally inputted value when the determination result indicates mismatching; and
rewriting the stored value in the memory cell where the change of the stored value is determined.

11. A program for executing operations of rewriting of a semiconductor memory device including a plurality of memory cells each having two or more storage statuses, a rewrite speed or a degree of deterioration of the memory cells varying depending on which one of the storage status is caused by rewriting, the program being recorded on a computer-readable medium and causing a CPU to perform the operations comprising:
determining, among a plurality of data storage units, each of which has a plurality of the memory cells and stores a value of one bit, one of the data storage units so as to store externally inputted data;
performing an operation with the stored values in the memory cells which constitute the determined data storage unit to obtain a stored value in the data storage unit;
comparing the stored values in the data storage unit obtained by the operation and the externally inputted value to determine whether both values match each other;
determining the memory cell whose stored value needs to be changed such that the stored value in the data storage unit is equal to the externally inputted value when the determination result indicates mismatching; and
rewriting the stored value in the memory cell where the change of the stored value is determined.

* * * * *